US007657863B2

(12) United States Patent
Iijima et al.

(10) Patent No.: US 7,657,863 B2
(45) Date of Patent: Feb. 2, 2010

(54) PATTERN AREA VALUE CALCULATING METHOD, PROXIMITY EFFECT CORRECTING METHOD, AND CHARGED PARTICLE BEAM WRITING METHOD AND APPARATUS

(75) Inventors: Tomohiro Iijima, Shizuoka (JP); Masafumi Ise, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 479 days.

(21) Appl. No.: 11/619,383

(22) Filed: Jan. 3, 2007

(65) Prior Publication Data
US 2007/0170374 A1    Jul. 26, 2007

(30) Foreign Application Priority Data
Jan. 24, 2006    (JP)    ............................. 2006-014881

(51) Int. Cl.
*G06F 17/50* (2006.01)
*G06F 19/00* (2006.01)
*G03F 1/00* (2006.01)
*G21K 5/00* (2006.01)

(52) U.S. Cl. ........................... 716/21; 700/98; 700/120; 700/121; 430/5; 378/35; 250/492.2; 250/492.3

(58) Field of Classification Search .................. 716/21; 700/98, 120, 121; 430/5; 378/35; 250/492.2, 250/492.3
See application file for complete search history.

(56) References Cited

U.S. PATENT DOCUMENTS 5,737,250 A * 4/1998 Sawahata ..................... 716/21
2002/0095648 A1 * 7/2002 Saito ........................... 716/10

FOREIGN PATENT DOCUMENTS

| JP | 5-121303    |   | 5/1993 |
| JP | 08115888 A  | * | 5/1996 |
| JP | 9-186058    |   | 7/1997 |
| JP | 11015947 A  | * | 1/1999 |

* cited by examiner

*Primary Examiner*—Phallaka Kik
(74) *Attorney, Agent, or Firm*—Oblon, Spivak, McClelland, Maier & Neustadt, L.L.P.

(57) ABSTRACT

A method for calculating area values of a pattern written by using a charged particle beam, includes virtually dividing a pattern into a plurality of mesh-like first square regions surrounded by first grids defined at intervals of a predetermined size, virtually dividing the pattern into a plurality of mesh-like second square regions surrounded by second grids defined at intervals of the predetermined size, wherein the second grids being positionally deviated from the first grids by a half of the predetermined size, distributing an area value of a sub-pattern in each of the second square regions to a plurality of apexes of each of the second square regions such that a center-of-gravity position of the sub-pattern does not change, wherein the sub-pattern being a part of the pattern, and outputting the distributed area values as area values, for correcting a proximity effect, defined at the center position of each of the first square regions.

18 Claims, 11 Drawing Sheets

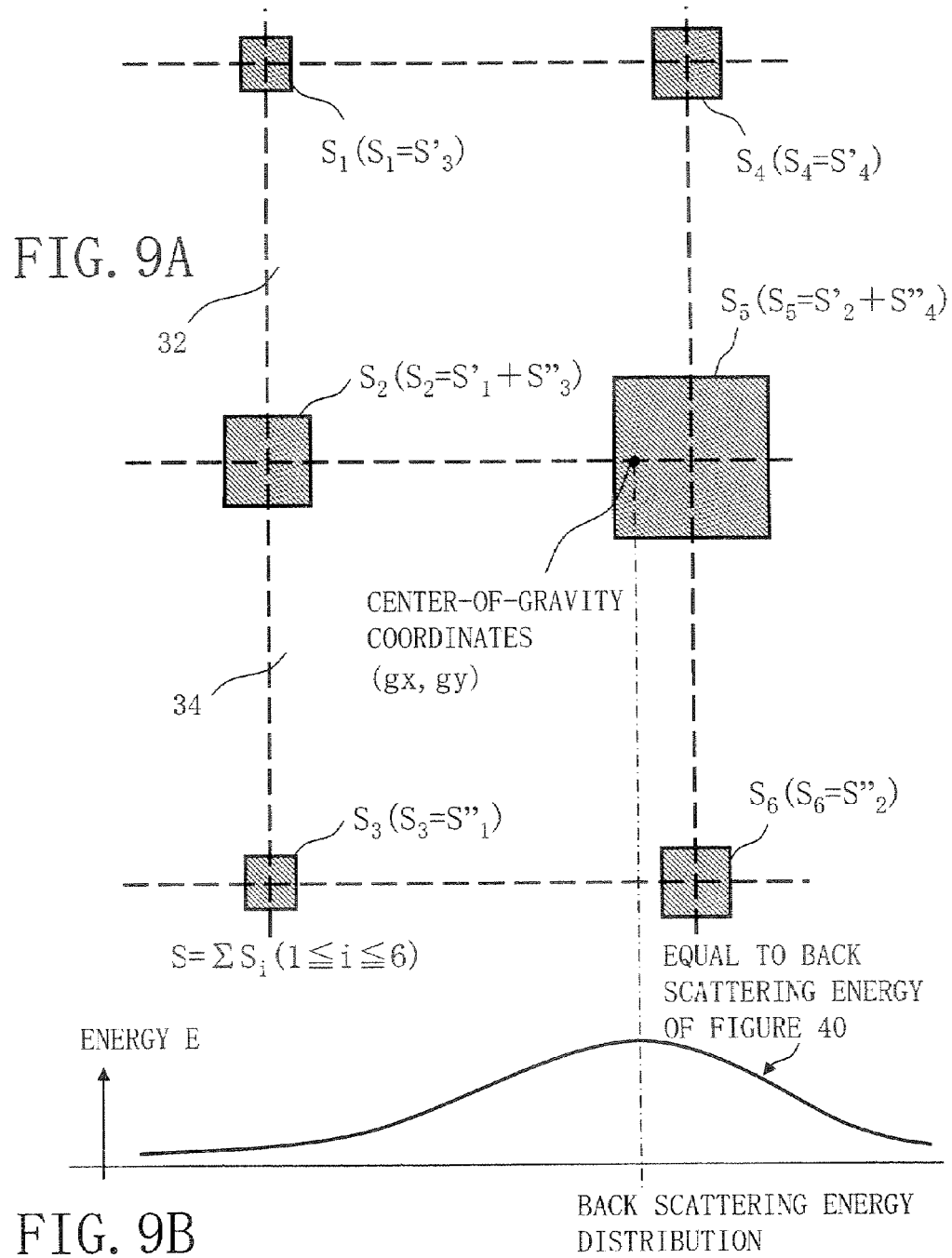

US 7,657,863 B2

PATTERN AREA VALUE CALCULATING METHOD, PROXIMITY EFFECT CORRECTING METHOD, AND CHARGED PARTICLE BEAM WRITING METHOD AND APPARATUS

CROSS-REFERENCE TO RELATED APPLICATION

This application is based upon and claims the benefit of priority from prior Japanese Patent Application No. 2006-14881 filed on Jan. 24, 2006 in Japan, the entire contents of which are incorporated herein by reference.

BACKGROUND OF THE INVENTION

1. Field of the Invention

The present invention relates to a pattern area value calculating method, a method of calculating a proximity effect-corrected dose, a charged particle beam writing method, and a charged particle beam writing apparatus. For example, the present invention relates to a proximity effect correcting technique (to be described below) A pattern to be written is divided into predetermined unit sections (grids) The present invention relates to a proximity effect correcting technique which corrects a dose of an electron beam to be irradiated on each unit section in consideration of accumulated energy caused by back scattering of electrons.

2. Related Art

A lithography technique which leads development of micropatterning of semiconductor devices is a very important process which uniquely generates a pattern in semiconductor manufacturing processes. In recent years, with high integration of an LSI, a circuit line width required for semiconductor devices progressively decreases year after year. In order to form a desired circuit pattern on the semiconductor devices, a high-definition original pattern (also called a reticle or a mask) is necessary. In this case, an electron beam writing technique has an essentially excellent resolution and is used in production of a high-definition original pattern.

FIG. 11 is a conceptual diagram for explaining an operation of a conventional variable-shaped electron beam photolithography apparatus.

A variable-shaped electron beam photolithography apparatus (electron beam (EB) writing apparatus) operates as follows. In a first aperture 410, a square, for example, rectangular opening 411 to shape an electron beam 330 is formed. In a second aperture 420, a variable-shaped opening 421 to shape the electron beam 330 having passed through the opening 411 formed in the first aperture 410 in a desired square shape is formed. The electron beam 330 irradiated from a charged particle source 430 and having passed through the opening 411 is deflected by a deflector. The electron beam 330 passes through a part of the variable-shaped opening 421 and is irradiated on a target object 340 placed on a stage. The stage continuously moves in one predetermined direction (for example, defined as an X direction) while irradiating the electron beam 330. More specifically, a square shape which can pass through both the opening 411 and the variable-shaped opening 421 is written in a writing region of the target object 340 placed on the stage. A scheme which causes an electron beam to pass through both the opening 411 and the variable-shaped opening 421 to form an arbitrary shape is called a variable shaped scheme.

A pattern of a semiconductor integrated circuit is written on a resist material formed on the target object 340 by using an electron beam. In this case, the electron beam used in the pattern writing passes through the resist material and is incident on the target object 340. Then, back scattering occurs. A part of the electron beam is incident on the resist material again. As a result, the resist material is exposed in an area which is considerably larger than an incident part of the electron beam not to obtain a pattern having a desired line width. When patterns to be written approximate to each other due to micropatterning to increase the density, exposure of the resist material caused by back scattering occurs in a very wide range. Since this proximity effect is caused, correction must be performed. In general, when a pattern is written on the resist material on the substrate, a pattern to be written is divided into predetermined unit sections (to be referred to as grids or meshes). At the center of each unit section, accumulated energy caused by back scattering is calculated on the basis of an EID function. In consideration of the accumulated energy, a dose of an electron beam to be irradiated on each unit section is corrected.

In relation to the proximity effect correction, a technique which calculates accumulated energy on the basis of an EID function by replacing the center point of the unit section with an area gravity point is disclosed in a reference (for example, see JP-A-9-186058).

As described above, in the calculation of the proximity effect correction, a pattern to be written is divided into predetermined meshes, and accumulated energy caused by back scattering is calculated on the basis of an EID function at a center position of each mesh.

However, an area value included in a mesh is regarded to be concentrated on the center of the mesh to estimate a back scattering energy distribution. For this reason, the position is different from an arrangement position of an actual pattern. As a consequence, the back scattering energy distribution has an error. Since the back scattering energy distribution with the error is used in calculation of a beam dose on the pattern, the error adversely affects the calculation. Therefore, the beam dose to be calculated also has an error. The conventional technique has the above problems. At the present or in the future, with an increase in degree of integration density of an LSI, highly accurate proximity effect correction is required. In this circumstance, an error caused by indetermination of the area position is a factor which decreases correction accuracy near a figure.

BRIEF SUMMARY OF THE INVENTION

The present invention has as its object to reduce an error of a back scattering energy distribution.

In accordance with embodiment consistent with the present invention, there is provided a method for calculating area values of a pattern written by using a charged particle beam, including virtually dividing a pattern into a plurality of mesh-like first square regions surrounded by first grids defined at intervals of a predetermined size, virtually dividing the pattern into a plurality of mesh-like second square regions surrounded by second grids defined at intervals of the predetermined size, wherein the second grids being positionally deviated from the first grids by a half of the predetermined size, distributing an area value of a sub-pattern in each of the second square regions to a plurality of apexes of each of the second square regions such that a center-of-gravity position of the sub-pattern does not change, wherein the sub-pattern being a part of the pattern, and outputting the distributed area values as area values, for correcting a proximity effect, defined at the center position of each of the first square regions.

Also, in accordance with embodiment consistent with the present invention, there is provided a proximity effect correcting method including virtually dividing a pattern which is written by using a charged particle beam into a plurality of mesh-like square regions surrounded by grids defined at intervals of a predetermined size, distributing a part of area value of a sub-pattern in each of the square regions to a center position of another square region such that a center-of-gravity position of the sub-pattern does not change, wherein the part of area value being defined by the center position of the another square region and the sub-pattern being a part of the pattern, and calculating an amount of proximity effect correction in each square region by use of an area value of each square region obtained by adding remaining area value which is not distributed to other square region and area value distributed from other square region to output the amount of proximity effect correction.

Further, in accordance with embodiment consistent with the present invention, there is provided a method for writing a pattern using a charged particle beam, the method including, virtually dividing a pattern into a plurality of mesh-like square regions surrounded by grids defined at intervals of a predetermined size, distributing an area value of a sub-pattern in each of the square regions to positions where the distributed area values are defined by a center position of the square region and a center position of other square region, such that a center-of-gravity position of the sub-pattern in each of the square regions does not change, after the area values are distributed, calculating an exposure dose of the charged particle beam corrected with respect to proximity effect by using the area values defined by the center positions of the square regions, and writing the pattern on a target object at the exposure dose.

Additionally, in accordance with embodiment consistent with the present invention, there is provided a charged particle beam writing apparatus for writing a pattern using a charged particle beam, including a dividing unit configured to virtually divide a pattern into a plurality of mesh-like first square regions surrounded by first grids defined at intervals of a predetermined size and a plurality of mesh-like second square regions surrounded by second grids defined at intervals of the predetermined size, wherein the second grids being positionally deviated from the first grids by a half of the predetermined size, a distributing unit configured to distribute an area value of a sub-pattern in each of the second square region to a plurality of apexes of each of the second square regions such that a center-of-gravity position of the sub-pattern in each of the second square region does not change, wherein the sub-pattern being a part of the pattern, a calculating unit configured to calculate an amount of proximity effect correction for correcting proximity effect in each of the first square regions by using area values distributed and a pattern writing unit configured to write the pattern on a target object at an exposure dose of the charged particle beam corrected with respect to proximity effect by using the amount of proximity effect correction.

BRIEF DESCRIPTION OF THE DRAWINGS

FIGS. 9A and 9B are diagrams showing an example the distributed area values and a back scattering energy distribution in the first embodiment;

DETAILED DESCRIPTION OF THE INVENTION

In respective embodiment, a configuration using an electron beam will be described below as an example of a charged particle beam. The charged particle beam is not limited to an electron beam. A beam such as an ion beam using other charged particles may be used.

First Embodiment

Figure 1:
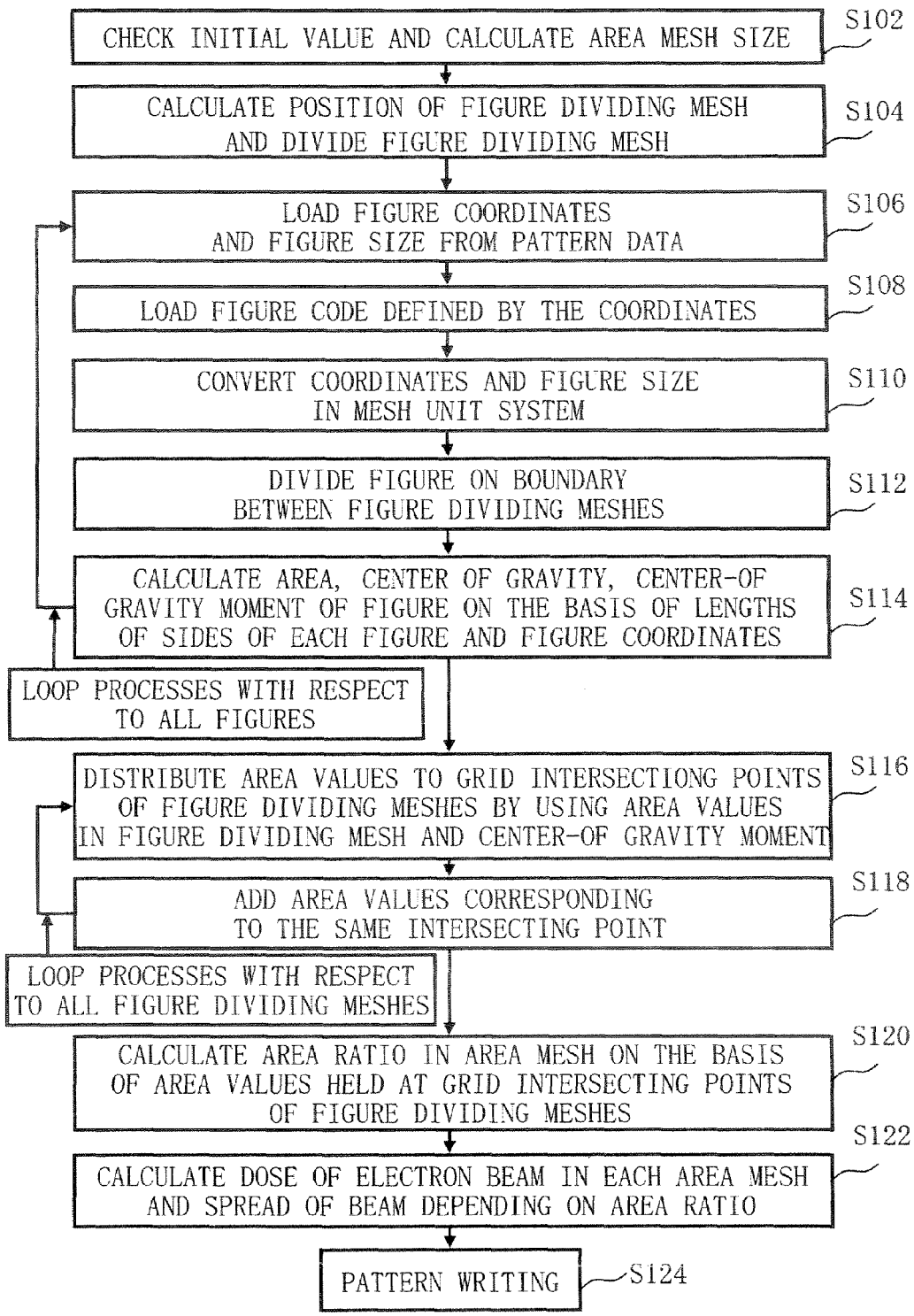
FIG. 1 shows a main part of a flow chart in a first embodiment.

FIG. 1 is a diagram showing a main part of a flow chart in a first embodiment.

In FIG. 1, a pattern area value calculating method performs a series of steps such as a check and mesh size calculating step (S102), a figure dividing mesh virtual dividing step (S104), a figure coordinate and figure size loading step (S106), a figure code loading step (S108), a mesh unit system converting step (S110), a figure dividing step (S112), an area, center of gravity, and moment calculating step (S114), an area value distributing step (S116), and an area value adding step (S118). In a proximity effect correcting method, a series of steps such as an area ratio calculating step (S120) and a beam dose calculating step (S122) is performed by using an area value obtained by the pattern area value calculating method. A charged particle beam writing method performs a pattern writing step (S124) by using a beam dose subjected to the proximity effect correction.

Figure 2:
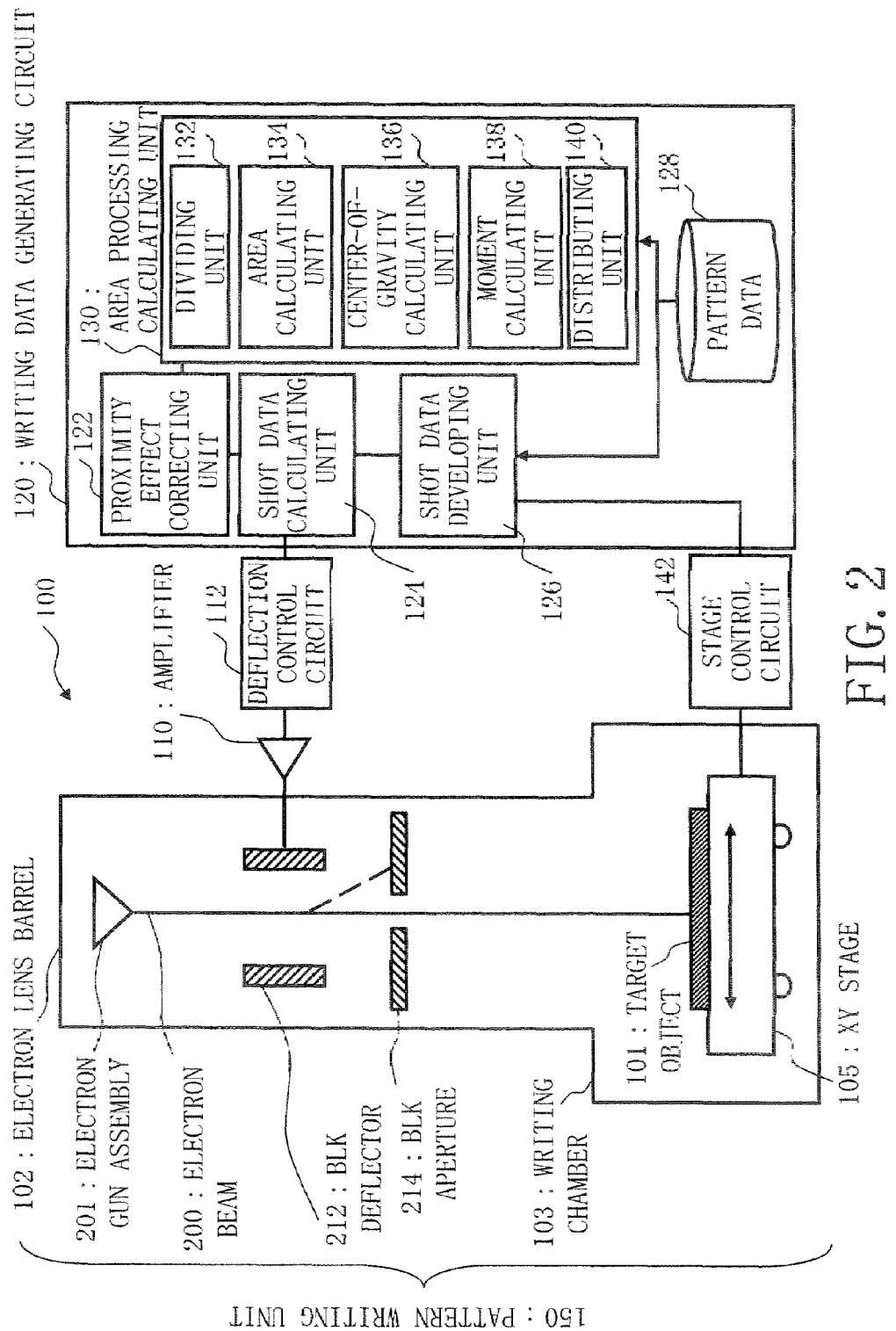
FIG. 2 is a conceptual diagram showing an example of a main configuration of a writing apparatus according to the first embodiment.

FIG. 2 is a conceptual diagram showing an example of a main configuration of a writing apparatus according to the first embodiment.

In FIG. 2, an electron beam writing apparatus is given as an example of a charged particle beam writing apparatus. A writing apparatus 100 serving as an example of an electron beam writing apparatus includes a pattern writing unit 150 and a control system. The writing apparatus 100 writes or "draws" a pattern onto a target object. The target object 101 includes a mask. The pattern writing unit 150 is equipped with an electron lens barrel 102 and a writing chamber 103. An electron gun assembly 201, a blanking (BLK) deflector 212, and a blanking (BLK) aperture 214 are arranged in the electron lens barrel 102. In the writing chamber 103, an XY stage 105 is arranged. The control system includes a deflecting amplifier 110, a deflection control circuit 112, a writing data generating circuit 120, and a stage control circuit 142. Arranged in the writing data generating circuit 120 are a proximity effect correcting unit 122, a shot data calculating unit 124, a shot data developing unit 126, an area processing calculating unit 130, and a magnetic disk device 128 serving as an example of a data storing device. The area processing calculating unit 130 has functions such as a dividing unit 132, an area calculating unit 134, a center-of-gravity calculating unit 136, a moment calculating unit 138, and a distributing unit 140. The magnetic disk device 128 has parameter data stored therein. The pattern data is input to the area processing calculating unit 130 from the magnetic disk device 128. Similarly, the pattern data is input from the magnetic disk device 128 to the shot data developing unit 126. In FIG. 2, constituent parts required to explain the first embodiment are described. For the writing apparatus 100, other necessary configurations are included as a matter of course.

In the writing data generating circuit 120, all or some of the other parts than the magnetic disk device 128 may be constituted by a CPU serving as an example of a computer. In this case, the CPU executes the processes of the respective functions such as the proximity effect correcting unit 122, the shot data calculating unit 124, the shot data developing unit 126, and the area processing calculating unit 130. Alternatively, except for the proximity effect correcting unit 122, the shot data calculating unit 124, and the shot data developing unit 126, the area processing calculating unit 130 may be constituted by a CPU serving as an example of a computer. In this case, the CPU executes the processes of the functions such as the dividing unit 132, the area calculating unit 134, the center-of-gravity calculating unit 136, the moment calculating unit 138, and the distributing unit 140. However, the invention is not limited to the above configurations. All or some of the writing data generating circuit 120, the proximity effect correcting unit 122, the shot data calculating unit 124, the shot data developing unit 126, the area processing calculating unit 130, the dividing unit 132, the area calculating unit 134, the center-of-gravity calculating unit 136, the moment calculating unit 138, and the distributing unit 140 may be realized by hardware constituted by electric circuits. Alternatively, these units may be realized by a combination of hardware constituted by electric circuits and software, or may be realized by a combination of the hardware and firmware.

The shot data calculating unit 124 in the writing data generating circuit 120 is connected to the deflection control circuit 112 through a bus (not shown). The proximity effect correcting unit 122 and the shot data developing unit 126 are connected to the shot data calculating unit 124 through a bus (not shown). The area processing calculating unit 130 is connected to the proximity effect correcting unit 122 through a bus (not shown). The stage control circuit 142 is connected to the shot data developing unit 126 through a bus (not shown).

An electron beam 200 emitted from the electron gun assembly 201 is irradiated on a desired position of a target object 101 on the XY stage 105. The XY stage 105 is movably arranged. The XY stage 105 moves under the control of the stage control circuit 142. The electron beam 200 serves as an example of a charged particle beam. The stage control circuit 142 receives a shot density from the shot data developing unit 126 to calculate a stage speed of the XY stage 105 on the basis of the shot density.

In this case, the electron beam 200 on the target object 101 is prevented from reaching the upper surface of the target object 101 when it is beam irradiation time at which the electron beam of a desired dose is incident on the target object 101. This is intended to prevent the electron beam 200 from being excessively irradiated on the target object 101. For example, the electron beam 200 is deflected by an electrostatic BLK deflector 212. The BLK aperture 214 cuts the electron beam 200. In this manner, the electron beam 200 is prevented from reaching the upper surface of the target object 101. A deflecting voltage of the BLK deflector 212 is controlled by the deflection control circuit 112 and the deflecting amplifier 110.

In a beam-on (blanking-off) state, the electron beam 200 emitted from the electron gun assembly 201 travels a path indicated by a solid line in FIG. 2. In a beam-off (blanking-on) state, on the other hand, the electron beam 200 emitted from the electron gun assembly 201 travels on a path indicated by a dotted line in FIG. 2. The insides of the electron lens barrel 102 and the writing chamber 103 in which the XY stage 105 is arranged are evacuated by a vacuum pump (not shown), and a vacuum atmosphere has a pressure lower than the atmospheric pressure.

In FIG. 2, constituent parts required to explain the first embodiment are described. However, the writing apparatus 100 may include, in addition to the configuration described above, the following configuration. That is, an illumination lens, a first aperture, a projection lens, a shaping deflector, a second aperture, an objective lens, an objective deflector, and the like may be arranged in the electron lens barrel 102. In a beam-on (blanking-off) state, the configuration is made such that the electron beam 200 emitted from the electron gun assembly 201 entirely illuminates a first aperture having a square, for example, rectangular opening through an illumination lens. First, the electron beam 200 is shaped in a square, for example, rectangular shape. The electron beam 200 of a first aperture image having passed through the first aperture is projected on a second aperture by a projection lens. A position of the first aperture image on the second aperture is controlled by a shaping deflector. In this manner, the beam shape and the beam size can be changed. The electron beam 200 of the second aperture image having passed through the second aperture is focused by an objective lens. The electron beam 200 is deflected by an objective deflector and irradiated on a desired position of the target object 101 on the X-Y stage 105. At this time, the XY stage 105 moves. With the configuration, a variable-shaped EB photolithography apparatus can be obtained.

In step S102, as a check and mesh size calculating step, the writing data generating circuit 120 checks initial values such as mesh parameters N and m. In a proximity effect correcting process, a writing pattern which is written by using the electron beam 200 is divided into predetermined unit sections (to be referred to as grids or meshes) At a center position of each unit section, and accumulated energy caused by back scattering is calculated on the basis of an EID function.

Figure 3:
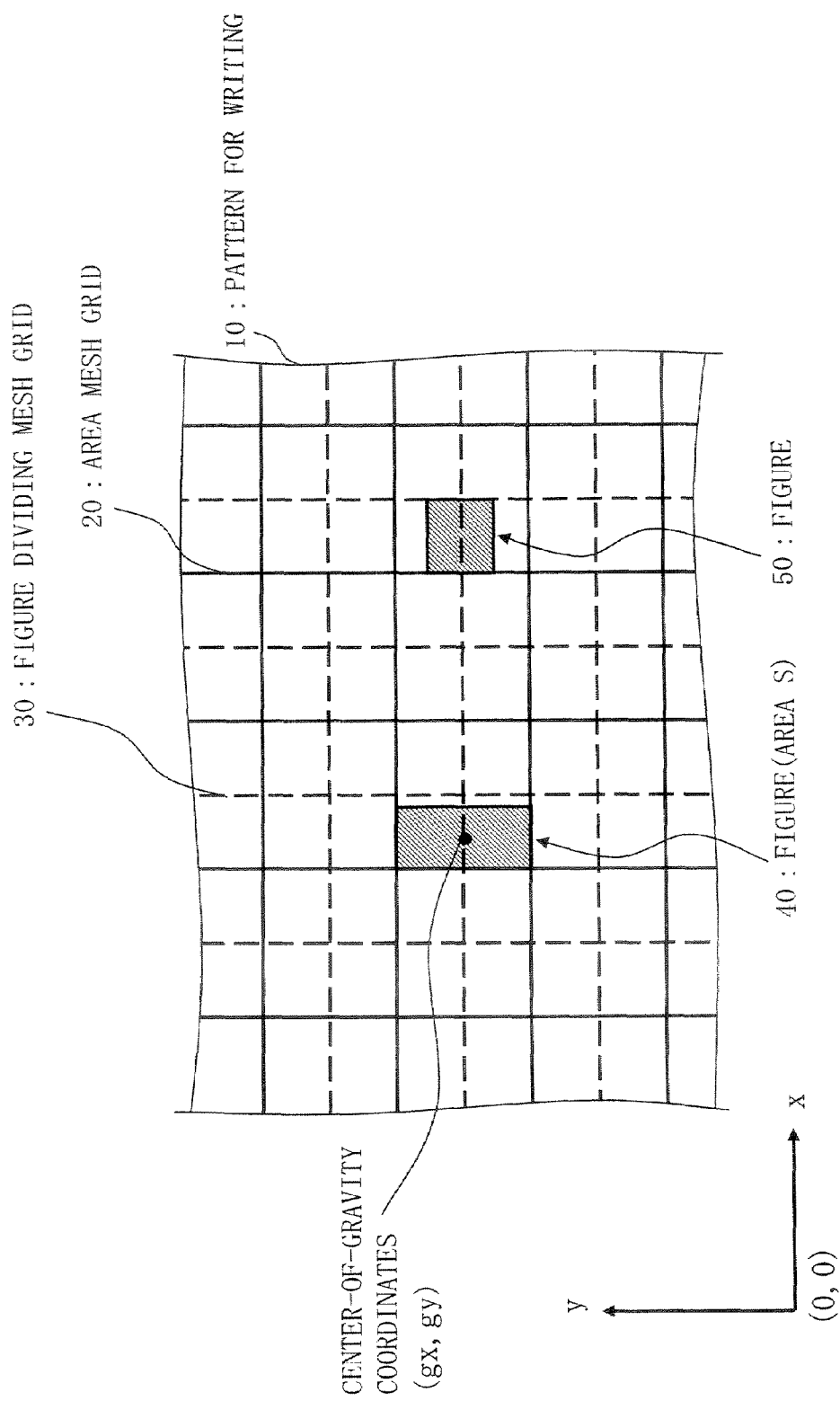
FIG. 3 is a diagram showing a part of a writing pattern divided like a mesh in the first embodiment.

FIG. 3 is a diagram showing a part of a writing pattern divided like a mesh in the first embodiment.

In FIG. 3, by way of example, a figure 40 and a figure 50 to be written in a writing pattern 10 are defined. The pattern 10 is virtually divided into a plurality of area meshes (first square regions) for a proximity effect correcting process. Each area mesh is defined as a region surrounded by area mesh grids 20 (solid line) written at intervals of a predetermined size. The area mesh is set at $2^m/N$ (AU) expressed by using a minimum unit (to be referred to as an AU unit system) obtained when coordinates of a pattern for writing and a figure size are expressed as integer values as a predetermined size (mesh size) In general, several nm to several Å are often set per 1 AU. When $2^m/N$ is set, division (will be necessary later) can be replaced with bit shift of an integer value. As a result, an amount of calculation can be reduced. For example, the values are given by $12 \leq m \leq 15$ and $1 \leq N \leq 7$. In the area value calculating method according to the first embodiment, by a method (to be described later), an area value of a pattern in area meshes defined by center positions of the area meshes is calculated. In the proximity effect correcting method, the area values defined at the center positions are used in proximity effect correction for electron beam writing.

The writing data generating circuit 120 checks initial values such as mesh parameters N and m. The value $2^m/N$ is calculated as a mesh size.

In S104, as a figure dividing mesh virtual dividing step serving as an example of a virtual dividing step, the dividing unit 132 virtually divides the writing pattern 10 into a plurality of figure dividing meshes (second square regions). The figure dividing meshes are meshes having equal mesh sizes and obtained by deviating the area meshes with respect to mesh original positions in an x direction and a y direction by a half of a mesh size (½ mesh). Each figure dividing mesh, as shown in FIG. 3, is defined as a region surrounded by figure dividing mesh grids 30 (dot line) written at intervals of a mesh size equal to that of the area mesh. The mesh is defined by deviating the mesh original position by the ½ mesh to make it possible to set an intersecting point of the figure dividing mesh grids 30 as a center position of each area mesh. The intersecting point of the figure dividing mesh grids 30 is an apex of each figure dividing mesh. Therefore, the position of the apex of each figure dividing mesh can be set as the center position of each area mesh.

In S106, as a figure coordinate and figure size loading step, the area processing calculating unit 130 loads pattern data from the magnetic disk device 128. The area processing calculating unit 130 loads figure coordinates and a figure size of the pattern 10 defined by the pattern data.

In S108, as a figure code loading step, the area processing calculating unit 130 loads a figure code defined by the loaded figure coordinates. In FIG. 3, as an example, the figure 40 and the figure 50 which are based on the figure coordinates, the figure size, and the figure code are described.

In S110, as a mesh unit system converting step, the area processing calculating unit 130 converts the coordinates and the figure size of the pattern 10 from the AU unit system into a mesh unit system. A conversion formula may be given by the following formula in which the values are divided by the mesh size:

Conversion Formula: (coordinate, length) [mesh]= (coordinate, length) $[AU] \times N/2^m$ In S112, as a figure dividing step, the dividing unit 132 divides the figure on a boundary between the figure dividing meshes.

Figure 4:
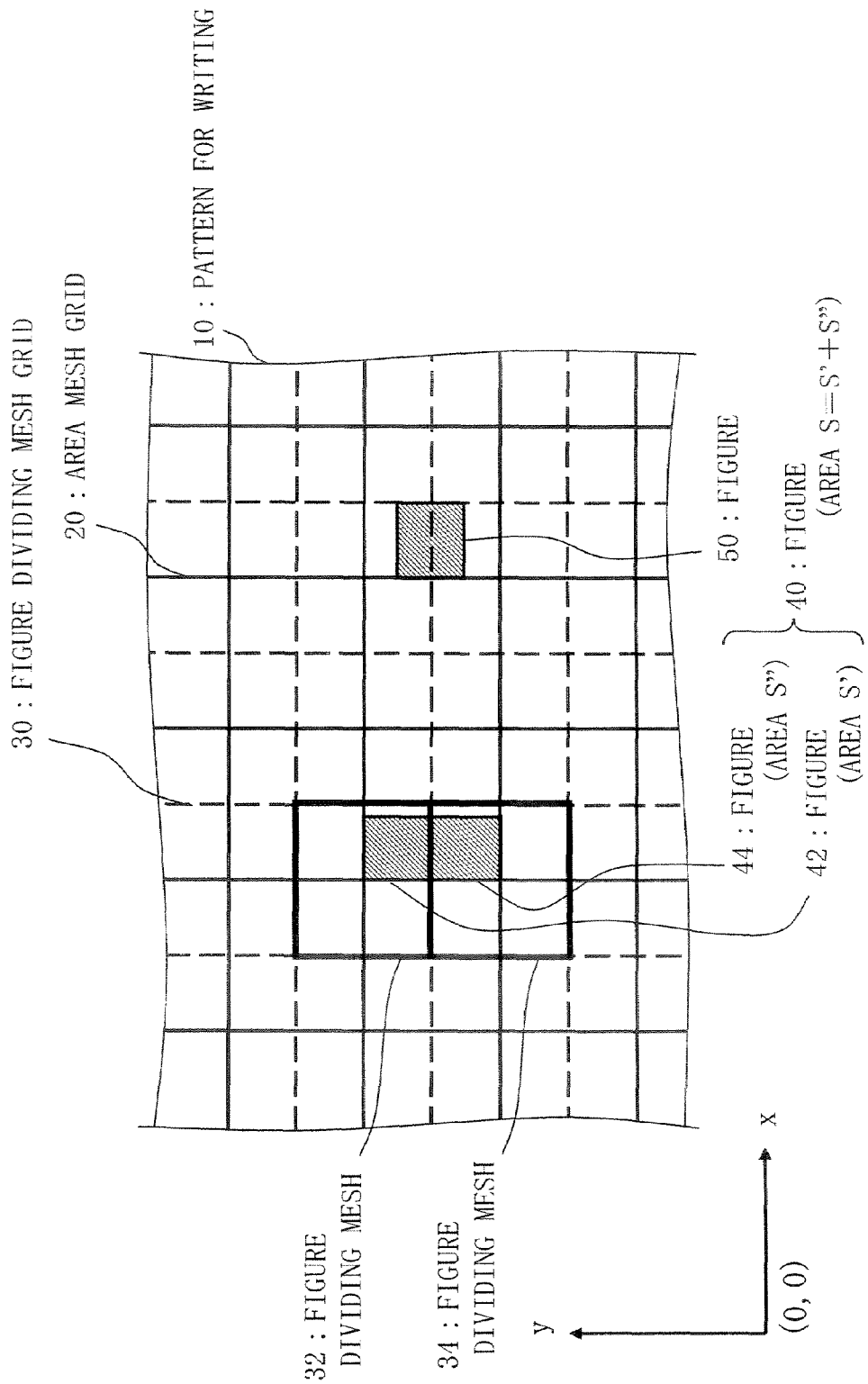
FIG. 4 is a diagram showing an example of a figure divided in figure dividing meshes in the first embodiment.

FIG. 4 is a diagram showing an example of a figure divided in figure dividing meshes according to the first embodiment. FIG. 4 shows, by way of example, a case in which the figure 40 is divided in a figure dividing mesh 32 and a figure dividing mesh 34. The figure 40 is a sub-pattern which is a part of pattern 10. As a result, in the figure dividing mesh 32, a figure 42 having an area S' and serving as a part of the figure 40 having an area S is divided. Also the figure 42 is a sub-pattern which is apart of pattern 10. In the figure dividing mesh 34, a figure 44 having an area S" and serving as a part of the figure 40 is divided. Also the figure 44 is a sub-pattern which is a part of pattern 10. As a matter of course, S=S'+S" is satisfied. Division of the figure 50 will be omitted in the drawing and explanation.

In S114, as an area, center of gravity, and moment calculating step, the area processing calculating unit 130 calculates the area, the center-of-gravity position, and the center-of-gravity moment of a figure on the basis of lengths of sides of the figures and figure coordinates. As an area value calculating step, the area calculating unit 134 calculates an area value of a figure on the basis of the lengths of the sides of the figures.

Figure 5:
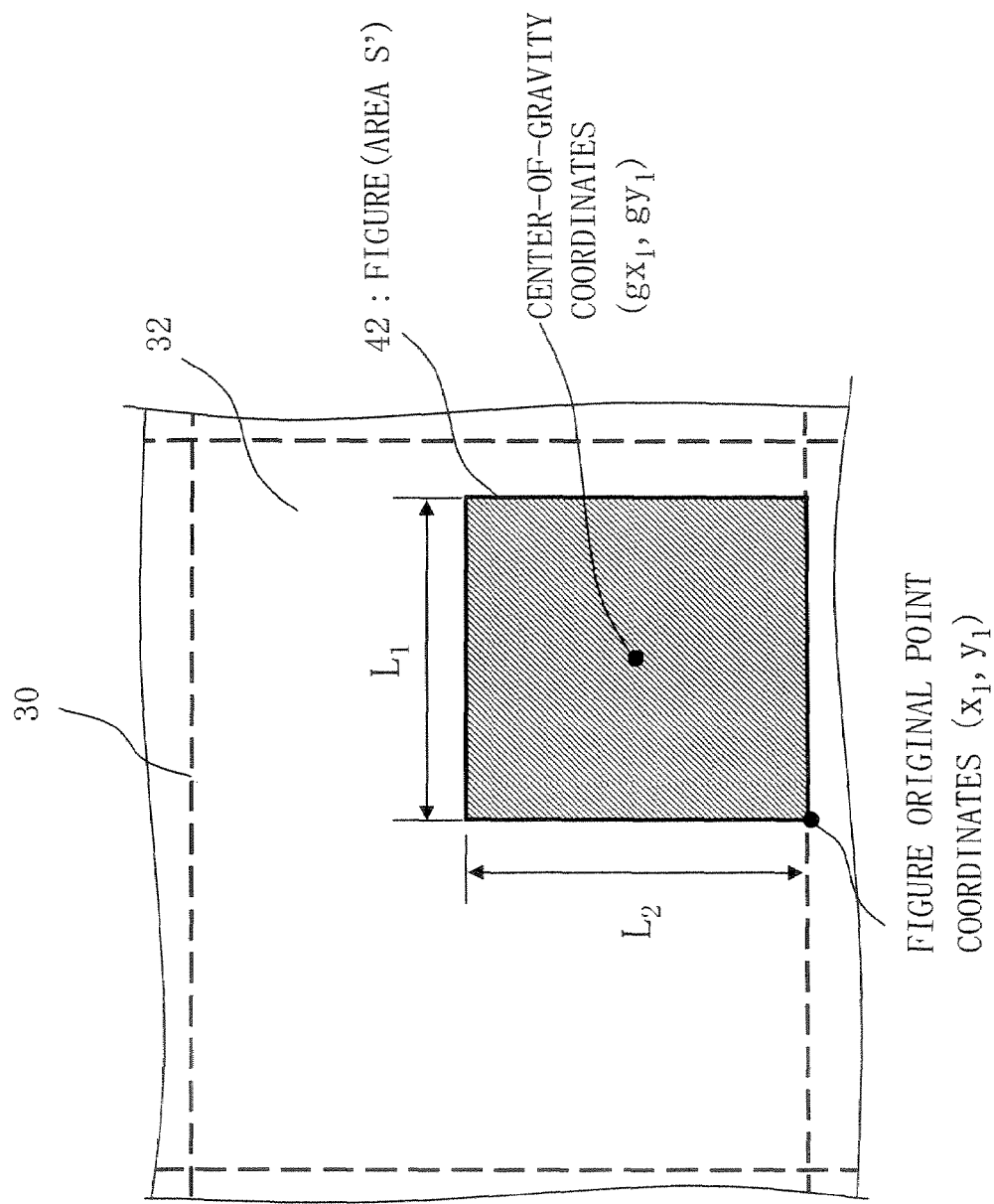
FIG. 5 is a diagram showing an example of a figure dividing mesh obtained by dividing the figure in the first embodiment.

FIG. 5 is a diagram showing an example of a figure dividing mesh obtained by dividing the figure in the first embodiment. FIG. 5 shows an appearance of the figure dividing mesh 32 as an example. When lengths of sides of the figure 42 divided in the figure dividing mesh 32 are $L_1$ in the x direction and $L_2$ in the y direction, the area S' of the figure 42 can be calculated by multiplying $L_1$ by $L_2$.

As a center-of-gravity position calculating step, the center-of-gravity calculating unit 136 calculates a center-of-gravity position of a figure on the basis of the lengths of the sides of the figures and the figure coordinates. In the example in FIG. 5, a lower left corner of the figure dividing mesh is set at an original point (0, 0). Coordinates of a figure original point of the figure 42 is given by $(X_1, y_1)$. In this case, center-of-gravity position coordinates $(gx_1, gy_1)$ of the figure 42 can be calculated by the following equation. Note that it is assumed that the following coordinate system is converted into a mesh unit system.

$gx_1 = x_1 + L_1/2, gy_1 = y_1 + L_2/2$

As a center-of-gravity moment calculating step, the moment calculating unit 138 calculates a center-of-gravity moment of a figure on the basis of an area value of the figure and a center-of-gravity position of the figure. In the example in FIG. 5, a center-of-gravity moment $(S'gx_1, S'gy_1)$ of the figure 42 can be calculated by the following equation:

$S'gx_1 = S' \times gx_1, S'gy_1 = S' \times gy_1$

The steps S106 to S114 described above are looped with respect to all figures (repeated).

In S116, as an area value dispersing step serving as a part of an area value distributing step, the distributing unit 140 distributes area values of patterns of each figure dividing mesh to a plurality of apexes of the figure dividing mesh. At this time, the area values are distributed to the apexes such that the center-of-gravity positions of the patterns in each figure dividing mesh do not change.

The distributing unit 140 performs distribution such that area values of figures in each figure dividing mesh are distributed (dispersed) to a plurality of apexes of the figure dividing meshes by using the area values of the figures and the center-of-gravity moment of the figures in each figure dividing mesh. More specifically, the distribution is performed such that the area values are distributed (dispersed) to intersecting points of the figure dividing mesh grids 30.

In other words, the area values of the patterns in each area mesh are distributed such that the area values are defined by the apexes of the figure dividing mesh at a center position of a certain area mesh and apexes of a figure dividing mesh at a center position of another area mesh. The area values are distributed such that center-of-gravity positions of the patterns in the area meshes are equal to each other. More specifically, some area values of the figures in the area meshes are distributed such that the center-of-gravity positions of the patterns are defined by center positions of another plurality of area meshes to be equal to each other.

Figure 6:
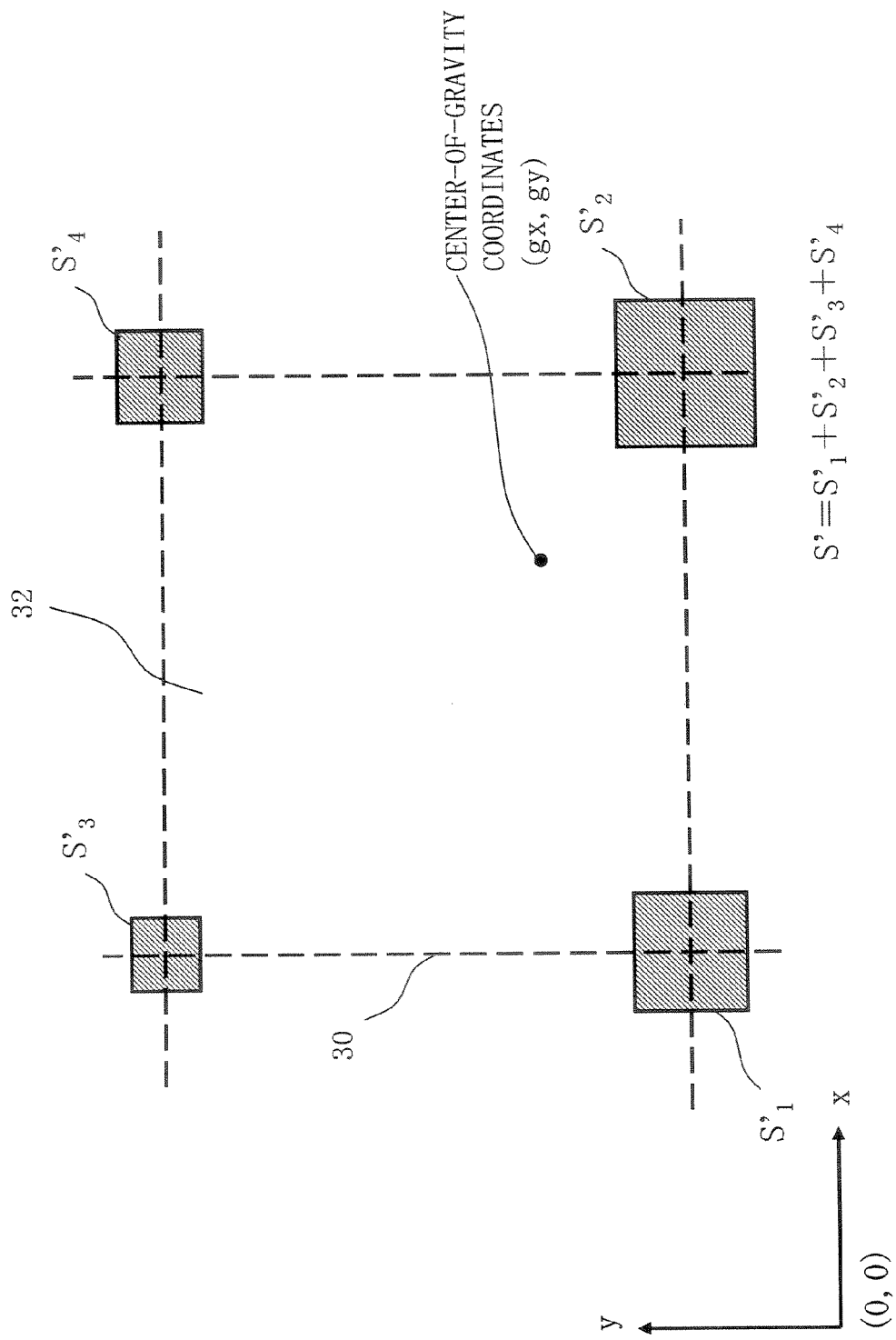
FIG. 6 is a diagram showing an example of an area value distributed in the first embodiment.

FIG. 6 is a diagram showing an example of distributed area values in the first embodiment.

FIG. 6 shows, as an example, an appearance of the figure dividing mesh 32. Area values S' of the figure 42 divided in the figure dividing mesh 32 are dispersed to four apexes (1 to 4) of the figure dividing mesh 32 as area values S'1 to S'4 and distributed.

The area values dispersed are expressed by the following equations, respectively:

$$S'_1 = S' - S'_2 - S'_3 - S'_4$$

$$S'_2 = (S'gx_1 - S'gy_1)/2 + S'/4$$

$$S'_3 = (S'gy_1 - S'gx_1)/2 + S'/4$$

$$S'_4 = (S'gx_1 + S'gy_1)/2 - S'/4$$

According to these equations, area center-of-gravity position coordinates obtained when the area values $S'_1$ to $S'_4$ defined at the four apexes of the figure dividing mesh 32 can be made equal to center-of-gravity position coordinates ($gx_1$, $gy_1$) of the figure 42. An equation: $S' = S'_1 + S'_2 + S'_3 + S'_4$ is satisfied as a matter of course.

When a center-of-gravity moment is calculated such that a lower left corner of the figure dividing mesh is set as an original point (0, 0), a figure dividing mesh size expressed in the mesh unit system is 1. Therefore, a center-of-gravity moment of a sum of the areas arranged at the four apexes is given by:

$$(1 \times S'_2 + 1 \times S'_4, 1 \times S'_3 + 1 \times S'_4).$$

Therefore, it is understood that, when the equations $S'_1$ to $S'_4$ are assigned to the above equation, the resultant value is equal to the center-of-gravity moment calculated in FIG. 5.

In S118, as an area value adding step serving as a part of the area value distributing step, the distributing unit 140 cumulatively adds area values of patterns in another figure dividing mesh when the area values are distributed to any one of the apexes of the corresponding figure dividing mesh. In the example in FIG. 4, a figure 44 serving as a part of the figure 40 is divided in the figure dividing mesh 32 and the figure dividing mesh 34. For this reason, of the area values of the figure 44 divided in the figure dividing mesh 34, area values distributed to the apexes of the figure dividing mesh 32 are added to each other, i.e., cumulatively added to each other. Distribution of the area values of the figure 44 divided in the figure dividing mesh 34 will be described later.

The steps S116 to S118 described above are looped with respect to all figure dividing meshes (repeated).

Figure 7:
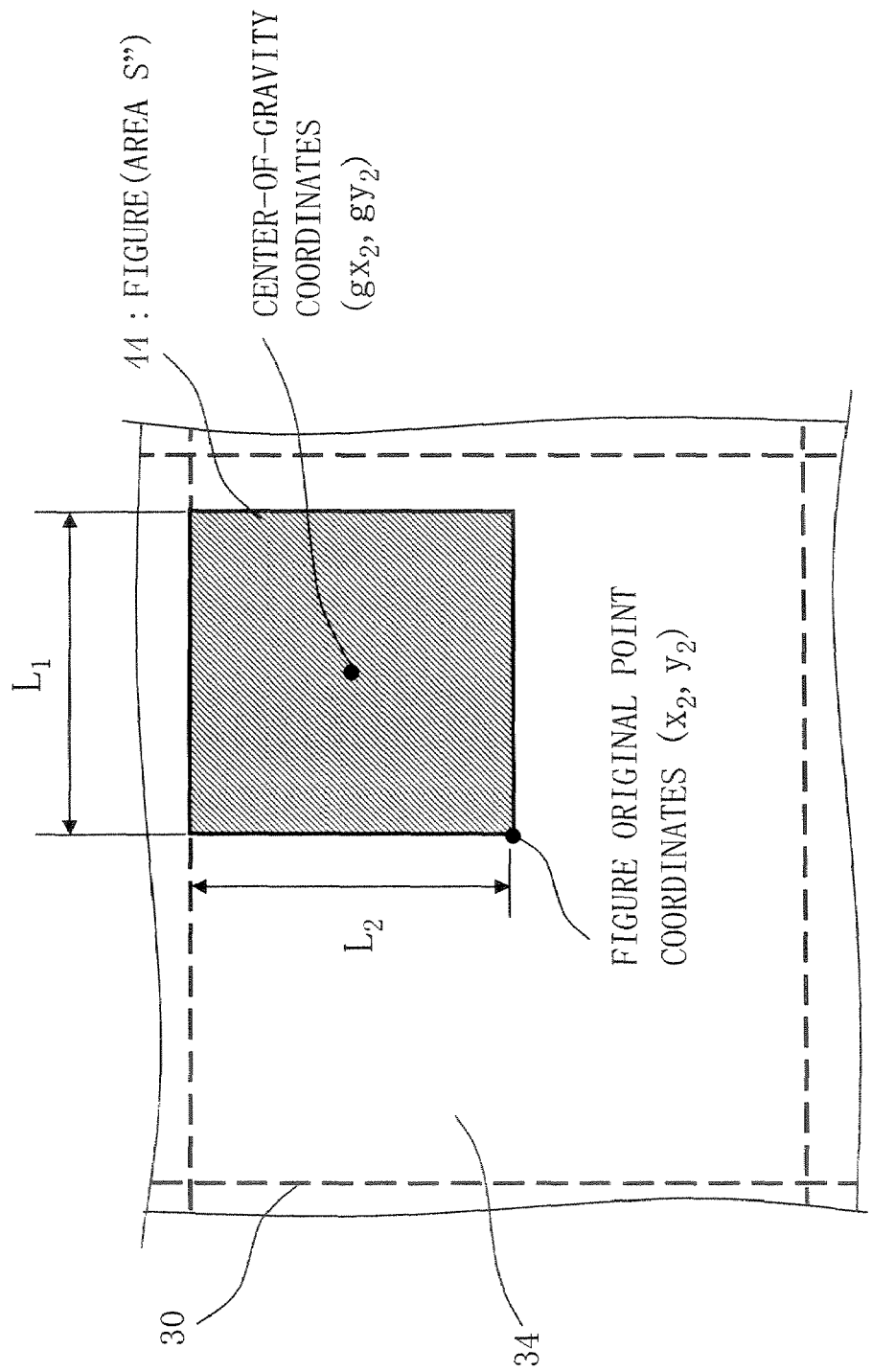
FIG. 7 is a diagram showing another example of the figure dividing mesh obtained by dividing the figure in the first embodiment.

FIG. 7 is a diagram showing another example of the figure dividing mesh in which the figure in the first embodiment is divided. FIG. 7 shows, as an example, an appearance of the figure dividing mesh 34. As described above, as the area value calculating step, the area calculating unit 134 calculates an area value of a figure on the basis of lengths of sides of each figure. When the lengths of the sides of the figure 44 divided in the figure dividing mesh 34 are given by $L_1$ in the x direction and $L_2$ in the y direction, the area S'' of the figure 44 can be given by $S'' = L_1 \times L_2$.

As a center-of-gravity position calculating step, the center-of-gravity calculating unit 136 calculates a center-of-gravity position of a figure on the basis of lengths of sides of each figure and figure coordinates. In the example in FIG. 7, when coordinates of a figure original point of the figure 44 are given by ($x_2$, $y_2$), center-of-gravity position coordinates ($gx_2$, $gy_2$) of the figure 44 can be calculated by the following equation:

$$gx_2 = x_2 + L_1/2, \quad gy_2 = y_2 + L_2/2$$

As a center-of-gravity moment calculating step, the moment calculating unit 138 calculates a center-of-gravity moment of a figure on the basis of an area value of a figure and a center-of-gravity position of the figure. In the example in FIG. 7, a center-of-gravity moment ($S''gx_2$, $S''gy_2$) of the figure 44 can be calculated by the following equation:

$$S''gy_2 = S'' \times gx_2, \quad S''gy_2 = S'' \times gy_2$$

As an area value dispersing step (S116) serving as a part of the area value distributing step, the distributing unit 140 distributes area value of pattern in each figure dividing mesh to a plurality of apexes of the figure dividing mesh such that a center-of-gravity position of the pattern in the figure dividing mesh is not changed. The distributing unit 140 performs distribution such that the area value of the figures in the figure dividing mesh is distributed (dispersed) by using the area value of the figure in the figure dividing mesh and the center-of-gravity moments of the figure. In the distribution, as described above, the area value are distributed (dispersed) to a plurality of apexes of the figure dividing mesh, i.e., intersecting points of the figure dividing mesh grids 30.

Figure 8:
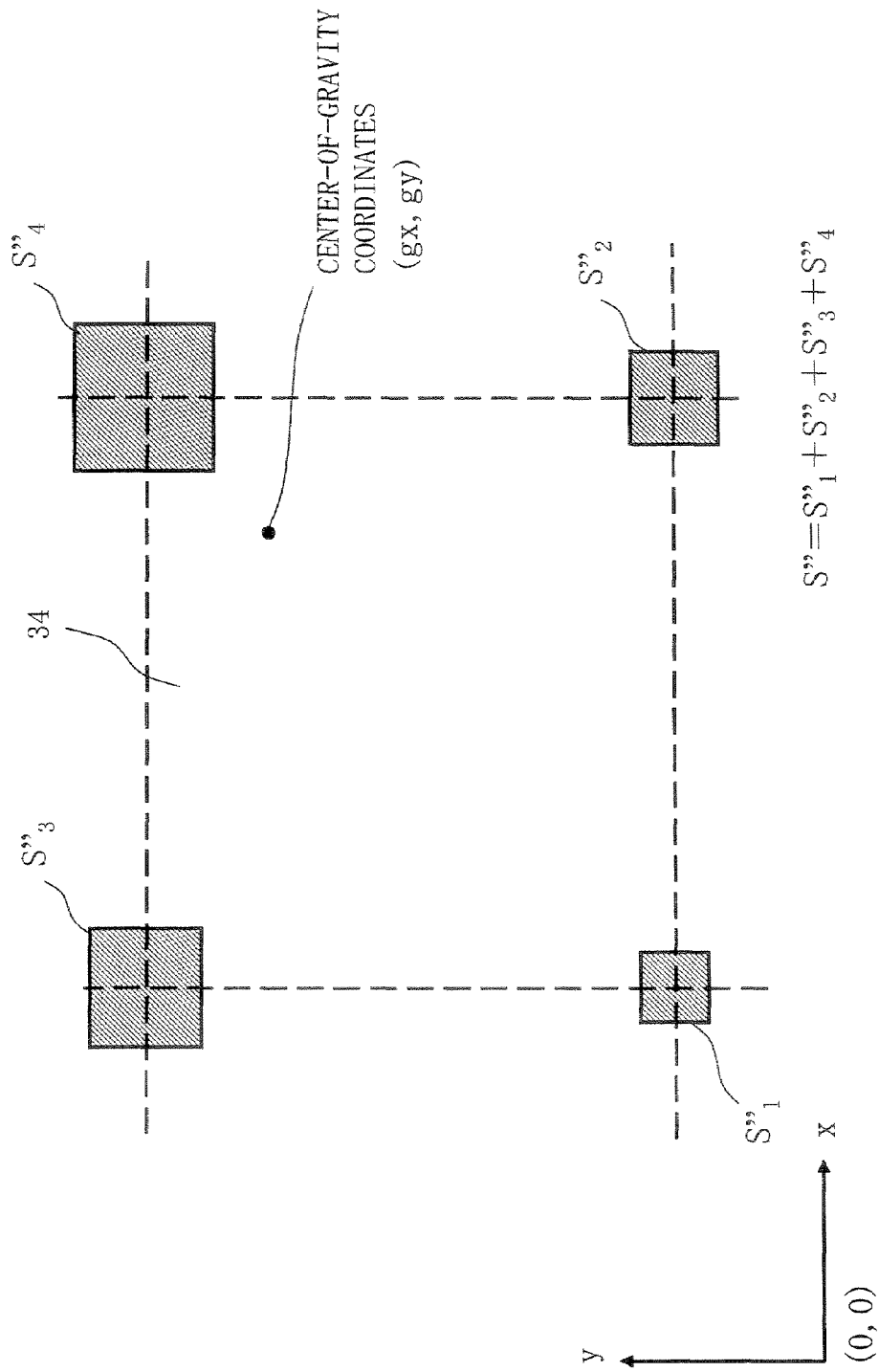
FIG. 8 is a diagram showing another example of the area value distributed in the first embodiment.

FIG. 8 is a diagram showing another example of the distributed area value in the first embodiment.

FIG. 8 shows, as an example, an appearance of the figure dividing mesh 34. Area value S'' of the figure 44 divided in the figure dividing mesh 34 are dispersed to the four apexes (1 to 4) of the figure dividing mesh 34 as area values $S''_1$ to $S''_4$ and distributed.

The area values dispersed are expressed by the following equations, respectively:

$$S''_1 = S'' - S''_2 - S''_3 - S''_4$$

$$S''_2 = (S''gx_2 - S''gy_2)/2 + S''/4$$

$$S''_3 = (S''gy_2 - S''gx_2)/2 + S''/4$$

$$S''_4 = (S''gx_2 + S''gy_2)/2 - S''/4$$

According to these equations, area center-of-gravity position coordinates obtained when the area values $S''_1$ to $S''_4$ defined at the four apexes of the figure dividing mesh 34 can be made equal to center-of-gravity position coordinates ($gx_2$, $gy_2$) of the figure 44. An equation: $S'' = S''_1 + S''_2 + S''_3 + S''_4$ is satisfied as a matter of course.

In this case, apex 1 of the four apexes of the figure dividing mesh 32 is also apex 3 of the figure dividing mesh 34. Similarly, apex 2 of the four apexes of the figure dividing mesh 32 is also apex 4 of the figure dividing mesh 34. Therefore, as an area value adding step (S118) serving as a part of the above-described area value distributing step, the distributing unit 140 cumulatively adds $S''_3$ to dispersed $S'_1$ with respect to apex 1 of the four apexes of the figure dividing mesh 32. Similarly, the distributing unit 140 cumulatively adds $S''_4$ to dispersed $S'_2$ with respect to apex 2 of the four apexes of the figure dividing mesh 32.

FIGS. 9A and 9B are diagrams showing an example of distributed area values and a back scattering energy distribution in the first embodiment.

In FIG. 9A, appearances of the figure dividing mesh 32 and the figure dividing mesh 34 are shown as an example. An area value $S_2$ at apex 2 in FIG. 9A is a sum of an area value $S'_1$ and an area value $S''_3$. Similarly, an area value $S_5$ at apex 5 in FIG. 9A is a sum of an area value $S'_2$ and an area value $S''_4$. When the area values at the respective apexes are cumulatively added to each other, area center-of-gravity position coordinates obtained when the area values $S_1$ to $S_6$ are synthesized with each other can be made equal to the center-of-gravity position coordinates (gx, gy) of the original figure 40 before the figure is not divided. The area values $S_1$ to $S_6$ are equal to area values defined with respect to six apexes of the figure dividing mesh 32 and the figure dividing mesh 34. The area value S of the figure 40 is given by $S=S_1+S_2+S_3+S_4$ as a matter of course.

By using the area values ($S_1$ to $S_6$) in area meshes defined at the apexes of the figure dividing meshes, i.e., center positions of the area meshes, a back scattering energy distribution is calculated. In this case, as shown in FIG. 9B, a position of the calculated back scattering energy distribution can be made equal to a back scattering energy distribution of the figure 40.

As described above, in the first embodiment, some area values of the patterns in each area mesh are distributed such that center-of-gravity positions of the patterns in the area mesh are defined by center positions of another plurality of area meshes to be equal to each other. In other words, the area values of the patterns in each figure dividing mesh are distributed to the plurality of apexes of the figure dividing mesh such that the center-of-gravity positions of the patterns in the figure dividing mesh do not change. In this manner, area values at the center positions of each area mesh can be obtained. Since the area values are distributed such that the center-of-gravity positions of the patterns in the figure dividing mesh do not change, the center-of-gravity positions obtained when the area values at the plurality of apexes of each figure dividing mesh are synchronized with each other do not change. As a result, the center-of-gravity positions obtained when the area values at the center positions of each area mesh are synchronized with each other also do not change. Accordingly, when a back scattering energy distribution is calculated by using the area values of the patterns in each area mesh defined at the center positions of the area mesh, deviations from the arrangement positions of the actual patterns can be canceled. For this reason, uncertainty of the area positions can be reduced. As a result, a position of the calculated back scattering energy distribution and a back scattering energy distribution of an actual figure can be made equal to each other, or an error of the back scattering energy distribution can be reduced.

Figures 10A, 10B:
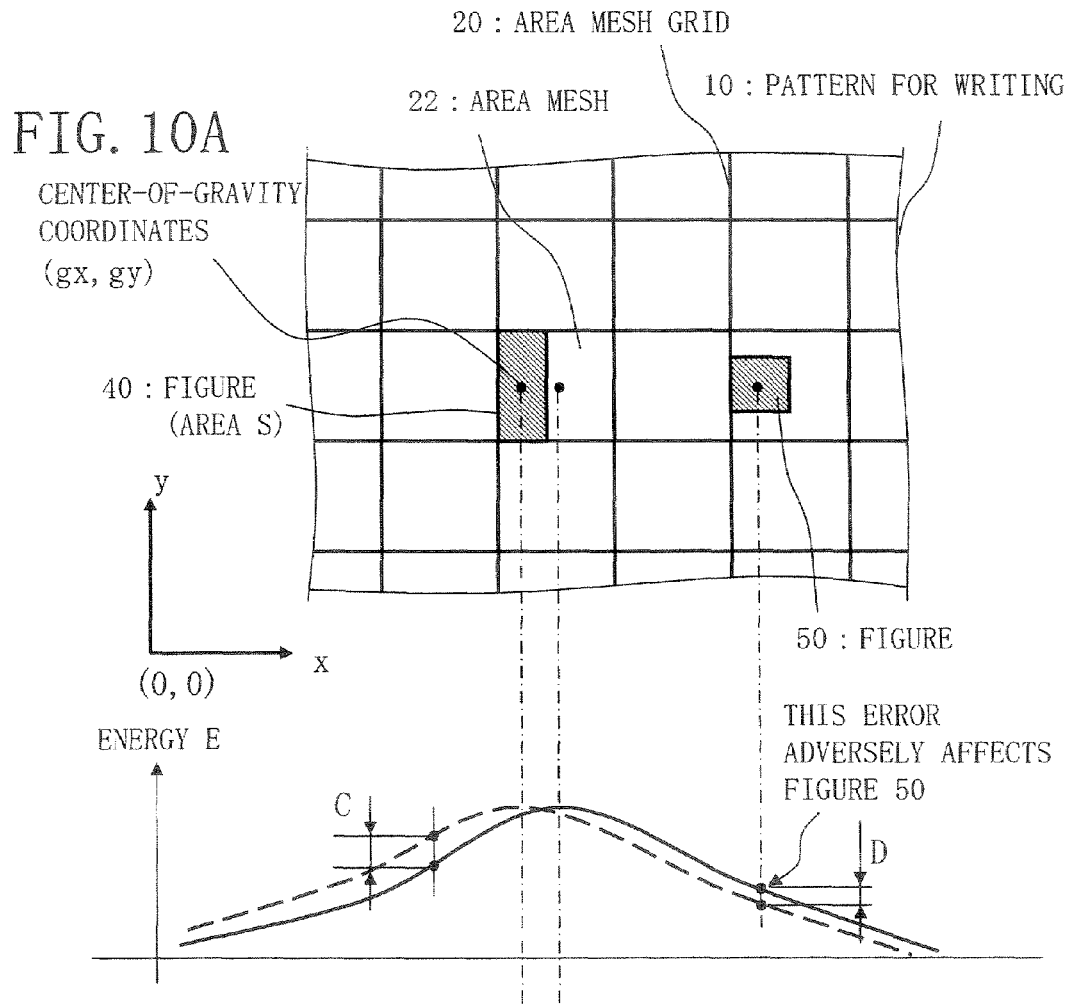
FIGS. 10A and 10B are diagrams showing an example of an appearance observed when area values of figures in an area mesh are not dispersed and a back scattering energy distribution.
Figure 11:
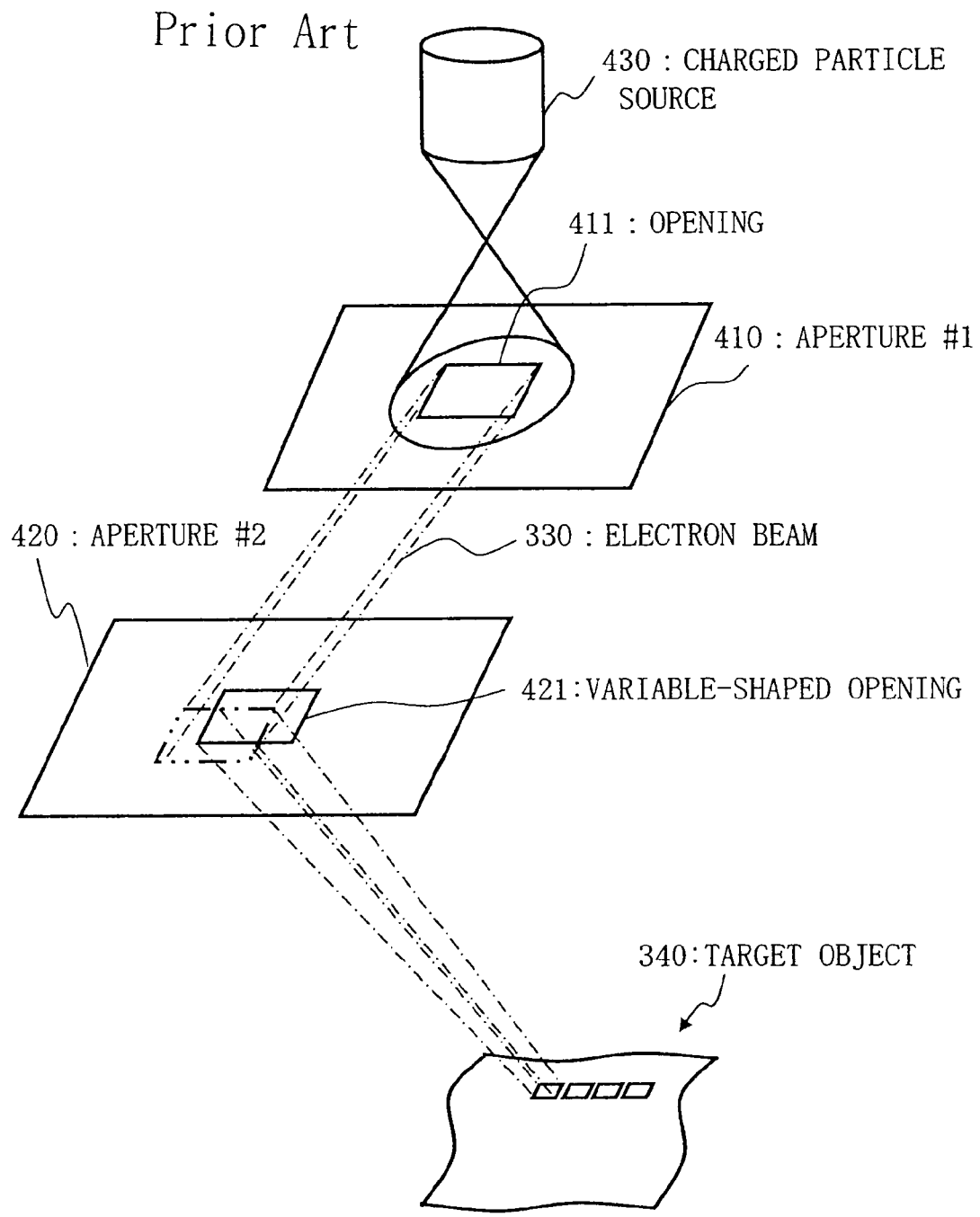
FIG. 11 is a conceptual diagram for explaining an operation of a conventional variable-shaped electron beam photolithography apparatus.

FIGS. 10A and 10B are diagrams showing an example of an appearance observed when area values of figures in an area mesh are not dispersed and a back scattering energy distribution.

Description will be given with respect to a case in which area values of figures in an area mesh are not distributed in the same arrangement of figures as the arrangement of the figures shown in FIG. 3. As shown in FIG. 10A, when area values of the figure 40 in an area mesh 22 are not distributed, the center position of the area pattern 22 deviates from the center-of-gravity position coordinates (gx, gy) of the figure 40. For this reason, when the area values of the figure 40 are defined at the center position of the area mesh 22, the position of the back scattering energy distribution deviates from the arrangement position of the figure 40 if a back scattering energy distribution is calculated by using the area values. As a result, as shown in FIG. 10B, an error C is generated between the position of the calculated back scattering energy distribution and the back scattering energy distribution of the actual figure. An error D corresponding to the position of the figure 50 adversely affects writing of the figure 50.

Therefore, as described in the first embodiment, the position of the calculated back scattering energy distribution is made equal to the back scattering energy distribution of an actual figure, or an error of the back scattering energy distribution is reduced to make it possible to eliminate or reduce the adverse affection. The distributing unit 140 outputs the area values to the proximity effect correcting unit 122.

In S120, as an area ratio calculating step, the proximity effect correcting unit 122 receives area values held at grid intersecting points of the figure dividing mesh obtained by the pattern area value calculating method and calculates an area ratio in each area mesh.

In S122, as an electron beam dose calculating step, the proximity effect correcting unit 122 calculates an amount of proximity effect correction in each area mesh depending on an area ratio in area meshes calculated by using area values held at grid intersecting points of the figure dividing meshes, i.e., the centers of the area meshes. The proximity effect correcting unit 122 outputs the amount of proximity effect correction to the shot data calculating unit 124. The shot data calculating unit 124 receives the amount of proximity effect correction from the proximity effect correcting unit 122. The shot data calculating unit 124 receives shot data developed by the shot data developing unit 126. The shot data calculating unit 124 calculates an exposure dose of electron beam obtained by performing proximity effect correction to the shot data. The back scattering energy distribution shown in FIG. 9B may be calculated such that an accumulated energy E generated by back scattering is calculated on the basis of an EID function. In consideration of the accumulated energy E, the dose of electron beam to be irradiated on each area mesh may be corrected to calculate an exposure dose of electron beam corrected with respect to proximity effect.

In S124, as a pattern writing step, the pattern writing unit 150 writes the pattern 10 onto the target object 101 at the exposure dose of electron beam. The shot data calculating unit 124 outputs a signal to the deflection control circuit 112 such that the calculated dose of electron beam corrected with respect to the proximity effect is obtained. The deflection control circuit 112 irradiates (beam-on) the electron beam 200 on the target object 101 at the dose of electron beam corrected with respect to proximity effect through the deflecting amplifier 110. When it is beam irradiation time at which the dose of electron beam is obtained, a voltage is applied to the BLK deflector 212 such that the electron beam 200 collides with a plane of the BLK aperture 214 to deflect the electron beam 200 (beam-off).

As described above, deviation from the arrangement position of the actual pattern can be eliminated. As a consequence, proximity effect correction in which a position of a calculated back scattering energy distribution is made equal to the back scattering energy distribution of an actual figure or an error of the back scattering energy distribution is reduced can be achieved. Therefore, a more accurate pattern can be written.

The embodiment is described above with reference to the concrete examples. However, the present invention is not limited to the concrete examples.

Parts such as an apparatus configuration or a control method which are not directly required to explain the present invention are omitted. However, a necessary apparatus configuration and a necessary control method can be appropriately selected and used. For example, although a control unit configuration for controlling the writing apparatus 100 is omitted, a necessary control unit configuration is appropriately selected and used, as a matter of course.

All pattern area value calculating methods, proximity effect correcting methods, charged particle beam writing apparatuses, charge particle beam writing methods which include the elements of the present invention and which can be appropriately changed in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for calculating area values of a pattern written by using a charged particle beam, comprising:
   storing data of a pattern in a data storing device;
   inputting the data of the pattern from the data storing device;
   virtually dividing the pattern into a plurality of mesh-like first square regions surrounded by first grids defined at intervals of a predetermined size;
   virtually dividing the pattern into a plurality of mesh-like second square regions surrounded by second grids defined at intervals of the predetermined size, the second grids being positionally deviated from the first grids by a half of the predetermined size;
   distributing an area value of a sub-pattern in each of the second square regions to a plurality of apexes of each of the second square regions such that a center-of-gravity position of the sub-pattern does not change, the sub-pattern being a part of the pattern; and
   outputting the distributed area values as area values, for correcting a proximity effect, defined at the center position of each of the first square regions.

2. The method according to claim 1, wherein
   when, in distribution of the area value of a sub-pattern of one second square region, an area value of a sub-pattern in another second square region is distributed to at least one apex of the one second square region, and the distributed area values of the at least one apex are cumulatively added to each other with respect to the at least one apex.

3. The method according to claim 1, further comprising:
   calculating an area value of the sub-pattern in each of the second square regions;
   calculating a center-of-gravity position of the sub-pattern;
   calculating a center-of-gravity moment of the sub-pattern in each of the second square regions on the basis of the calculated area value and the calculated center-of-gravity position; and
   wherein, in distribution of the area value, the calculated area value of the sub-pattern is distributed by using the calculated area value and the calculated center-of-gravity moment.

4. The method according to claim 1, wherein
   the outputting the distributed area values as area values is performed by a computer.

5. The method according to claim 4, wherein
   the inputting the data of the pattern from the data storing device is performed by the computer.

6. The method according to claim 1, wherein
   the area values are calculated by a computer.

7. The method according to claim 1, further comprising
   writing the pattern on a target object using the charged particle beam.

8. A proximity effect correcting method comprising:
   storing data of a pattern in a data storing device;
   inputting the data of the pattern from the data storing device;
   virtually dividing the pattern which is to be written by using a charged particle beam, into a plurality of mesh-like square regions surrounded by grids defined at intervals of a predetermined size;
   distributing a part of an area value of a sub-pattern in each of the square regions to a center position of another square region such that a center-of-gravity position of the sub-pattern does not change, the part of the area value being defined by the center position of the another square region and the sub-pattern being a part of the pattern; and
   calculating an amount of proximity effect correction in each square region by use of an area value of each square region obtained by adding a remaining area value which is not distributed to another square region and an area value distributed from another square region to output the amount of proximity effect correction.

9. The proximity effect correcting method according to claim 8, further comprising:
   virtually dividing the pattern into a plurality of mesh-like second square regions surrounded by second grids defined at intervals of the predetermined size, the second grids being positionally deviated from the first grids by a half of the predetermined size,
   wherein, when distributing part of the area value, an area value of a sub-pattern in each of the second square regions is distributed to a plurality of apexes of each of the second square regions such that a center-of-gravity position of the sub-pattern in each of the second square regions does not change.

10. The method according to claim 8, wherein
    the inputting the data of the pattern from the data storing device is performed by a computer.

11. The method according to claim 8, wherein
    the calculating an amount of proximity effect correction in each square region is calculated by a computer.

12. The method according to claim 8, further comprising
    writing the pattern on a target object using a charged particle beam.

13. A method for writing a pattern using a charged particle beam, the method comprising:
    virtually dividing a pattern into a plurality of mesh-like square regions surrounded by grids defined at intervals of a predetermined size;
    distributing an area value of a sub-pattern in each of the square regions to positions where the distributed area values are defined by a center position of the square region and a center position of another square region, such that a center-of-gravity position of the sub-pattern in each of the square regions does not change;
    after the area values are distributed, calculating an exposure dose of the charged particle beam corrected with respect to proximity effect by using the area values defined by the center positions of the square regions; and
    writing the pattern on a target object at the exposure dose.

14. A charged particle beam writing apparatus for writing a pattern using a charged particle beam, comprising:
    a dividing unit configured to virtually divide a pattern into a plurality of mesh-like first square regions surrounded by first grids defined at intervals of a predetermined size and a plurality of mesh-like second square regions surrounded by second grids defined at intervals of the predetermined size, the second grids being positionally deviated from the first grids by a half of the predetermined size;
    a distributing unit configured to distribute an area value of a sub-pattern in each of the second square regions to a plurality of apexes of each of the second square regions such that a center-of-gravity position of the sub-pattern in each of the second square regions does not change, the sub-pattern being a part of the pattern;
    a calculating unit configured to calculate an amount of proximity effect correction for correcting proximity effect in each of the first square regions by using area values distributed; and a pattern writing unit configured to write the pattern on a target object at an exposure dose of the charged particle beam corrected with respect to proximity effect by using the amount of proximity effect correction.

15. The charged particle beam writing apparatus according to claim 14, further comprising
an area calculating unit configured to calculate an area value of the sub-pattern in each of the second square regions.

16. The charged particle beam writing apparatus according to claim 15, further comprising:
a center-of-gravity calculating unit configured to calculate a center-of-gravity position of the sub-pattern.

17. The charged particle beam writing apparatus according to claim 16, further comprising:
a moment calculating unit configured to calculate a center-of-gravity moment of the sub-pattern on the basis of the area value calculated and the center-of-gravity position calculated.

18. The charged particle beam writing apparatus according to claim 17, wherein
the distributing unit distributes the area value of the sub-pattern by using the area values calculated and the center-of-gravity moment calculated.

* * * * *